(12) United States Patent
Zhang et al.

(10) Patent No.: US 8,896,102 B2
(45) Date of Patent: Nov. 25, 2014

(54) DIE EDGE SEALING STRUCTURES AND RELATED FABRICATION METHODS

(71) Applicant: Freescale Semiconductor, Inc., Austin, TX (US)

(72) Inventors: Zhihong Zhang, Chandler, AZ (US); Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/747,094

(22) Filed: Jan. 22, 2013

(65) Prior Publication Data

US 2014/0203410 A1    Jul. 24, 2014

(51) Int. Cl.
*H01L 23/44* (2006.01)
*H01L 23/00* (2006.01)
*H01L 21/78* (2006.01)

(52) U.S. Cl.
CPC .............. *H01L 23/562* (2013.01); *H01L 21/78* (2013.01)
USPC ....................................................... 257/620

(58) Field of Classification Search
CPC ............................ H01L 23/562; H01L 21/78
USPC ....................................................... 257/620
See application file for complete search history.

(56) References Cited

U.S. PATENT DOCUMENTS

| | | | |
|---|---|---|---|
| 6,709,954 B1 * | 3/2004 | Werking | 438/460 |
| 7,820,519 B2 | 10/2010 | Roggenbauer et al. | |
| 8,188,543 B2 | 5/2012 | Roggenbauer et al. | |
| 2003/0122220 A1 * | 7/2003 | West et al. | 257/620 |
| 2005/0212071 A1 * | 9/2005 | Yue et al. | 257/452 |
| 2007/0007595 A1 * | 1/2007 | Hirano et al. | 257/347 |
| 2008/0122025 A1 * | 5/2008 | Roggenbauer et al. | 257/501 |
| 2008/0241976 A1 * | 10/2008 | Kishiro et al. | 438/17 |
| 2009/0134459 A1 * | 5/2009 | Goto et al. | 257/347 |
| 2010/0096699 A1 * | 4/2010 | Miyata | 257/347 |
| 2010/0200960 A1 | 8/2010 | Angyal et al. | |
| 2011/0278581 A1 * | 11/2011 | Inoue et al. | 257/66 |
| 2013/0187280 A1 * | 7/2013 | Yuan et al. | 257/773 |

* cited by examiner

*Primary Examiner* — A. Sefer
(74) *Attorney, Agent, or Firm* — Ingrassia Fisher & Lorenz, P.C.

(57) ABSTRACT

Die structures for electronic devices and related fabrication methods are provided. An exemplary die structure includes a diced portion of a semiconductor substrate that includes a device region having one or more semiconductor devices fabricated thereon and an edge sealing structure within the semiconductor substrate that circumscribes the device region. In one or more embodiments, the edge sealing structure includes a conductive material that contacts a handle layer of semiconductor material, a crackstop structure is formed overlying the sealing structure, wherein the crackstop structure and the edge sealing structure provide an electrical connection between the handle layer and an active layer of semiconductor material that overlies a buried layer of dielectric material on the handle layer.

19 Claims, 9 Drawing Sheets

DIE EDGE SEALING STRUCTURES AND RELATED FABRICATION METHODS

TECHNICAL FIELD

Embodiments of the subject matter described herein relate generally to semiconductor devices and methods for fabricating semiconductor devices, and more particularly, to protecting semiconductor devices from defects caused by wafer dicing.

BACKGROUND

Modern electronic devices often include different types of electrical components and/or circuitry that are fabricated on a piece of a semiconductor substrate before being packaged into the resulting electronic device. Typically, for purposes of manufacturing efficiency, the semiconductor substrate is a wafer of semiconductor material that has multiple instances of a particular electrical circuit fabricated thereon. These instances are separated by cutting the wafer (commonly referred to as dicing or singulating) into discrete pieces of the wafer (commonly referred to as dies), which may then be separately packaged to provide multiple separate instances of an electronic device. However, mechanical stresses exerted on the wafer during dicing can result in cracks or other physical defects in the individual dies, which, in turn, can impair the ability of the circuitry fabricated on those dies from functioning properly.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to semiconductor dies that include an edge sealing structure formed within a semiconductor substrate at or near the perimeter of the die to prevent cutting defects from propagating to the interior region of the semiconductor substrate having one or more semiconductor devices fabricated thereon. As described in greater detail below, in exemplary embodiments, a deep trench isolation region circumscribing the semiconductor devices is formed in the upper layer of a silicon-on-insulator (SOI) substrate to provide a sealing structure that provides protection from cutting defect propagation at or near the edges of the die during dicing. In this regard, after dicing, the deep trench isolation region of the edge sealing structure is the outermost deep trench isolation region on the semiconductor die.

In exemplary embodiments, a conductive material is formed in the interior of the deep trench isolation region, and the conductive material extends through both the upper layer and the buried dielectric layer of the SOI substrate to contact and thereby provide an electrical connection to the underlying handle layer of the SOI substrate. A vertical conductive crackstop structure is formed overlying the die edge sealing structure and configured to provide an electrical interconnection from the upper layer of the SOI substrate proximate the die edge sealing structure to the conductive material. In this manner, the crackstop structure and the die edge sealing structure cooperate to electrically connect the handle layer of the SOI substrate to the overlying layer of semiconductor material about the periphery of the device region to provide the voltage of the handle layer as a global ground reference voltage throughout the device region of the die. As used herein, a crackstop structure should be understood as referring to a vertical structure formed overlying a semiconductor substrate (e.g., within overlying metallization, via, or contact layers) that provides protection from lateral propagation of cutting defects while a die edge sealing structure should be understood as referring to a vertical structure formed within the semiconductor substrate that provides protection from lateral propagation of cutting defects within an edge (or scribe) region of the semiconductor substrate.

Figure 1:
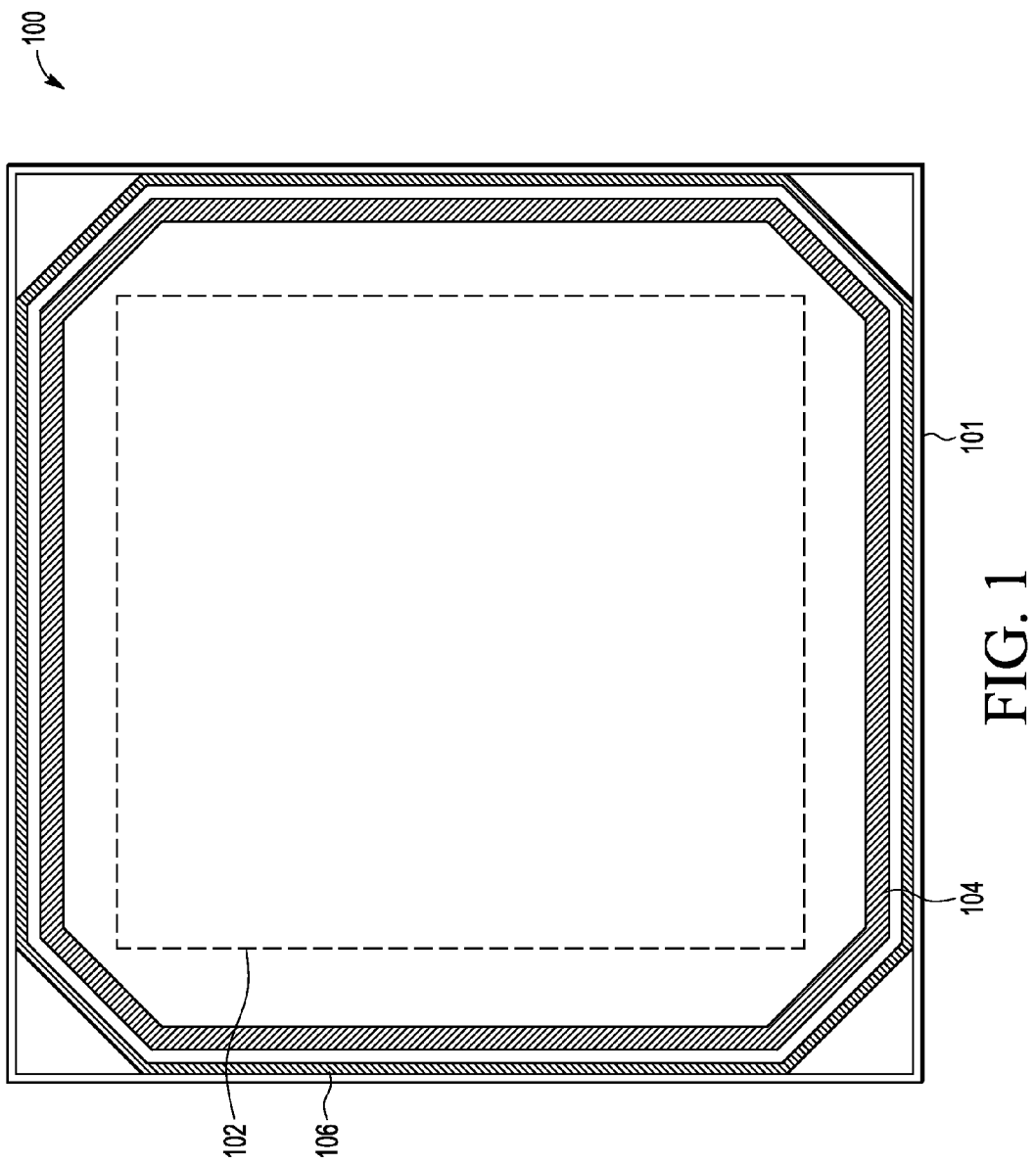
FIG. 1 is a schematic diagram of an exemplary semiconductor die structure for an electronic device in accordance with one embodiment of the invention.

FIG. 1 depicts a top view of an exemplary semiconductor die structure 100 that may be encapsulated or otherwise packaged to provide an integrated circuit or another electronic device. The die structure 100 is realized as a diced portion of a semiconductor substrate 101 that includes an interior device region 102 having a plurality of semiconductor devices (e.g., transistors, diodes, and the like) fabricated thereon, an inner crackstop structure 104 that circumscribes the device region, and an outer crackstop structure 106 that circumscribes the inner crackstop structure 104. The semiconductor devices fabricated on the device region 102 may be interconnected or otherwise configured to provide a desired functionality for the integrated circuit or other electronic device that includes the die structure 100, as will be appreciated in the art. The die structure 100 is obtained by dicing, singulating, or otherwise cutting a semiconductor substrate along one or more scribe lines proximate the outer crackstop structure 106. In this regard, the outer crackstop structure 106 is formed or otherwise fabricated in the edge region of the semiconductor substrate 101, so that the outer crackstop structure 106 remains with the diced portion of the semiconductor substrate 101 after the semiconductor substrate 101 is diced and the outer crackstop structure 106 is positioned at or near the perimeter (or periphery) of the die structure 100 after the dicing. Similarly, the inner crackstop structure 104 remains with the diced portion of the semiconductor substrate 101 after the dicing. In this manner, the outer crackstop structure 106 provides a first layer of protection from cutting defects during wafer dicing, while the inner crackstop structure 104 provides an added layer of protection in addition to the protection provided by the outer crackstop structure 106. It should be understood that FIG. 1 is a simplified representation of the die structure 100 for purposes of explanation, and is not intended to limit the subject matter described herein in any way. In this regard, the semiconductor devices formed on the device region 102 (and their various physical features) are not depicted in FIG. 1 because the subject matter described herein is not limited to any particular type or configuration of semiconductor devices fabricated on the device region 102 of the die structure 100. However, for purposes of explanation, the subject matter may be described herein in the context of one or more transistor devices being fabricated on the device region 102.

As described in greater detail below in the context of FIGS. 2-11, in exemplary embodiments, the semiconductor substrate 101 is a SOI substrate having a buried layer of dielectric material between a handle layer of semiconductor material and an active layer of semiconductor material, wherein the semiconductor devices of the device region 102 are fabricated or otherwise formed in the active layer of semiconductor material overlying the buried layer. The inner crackstop structure 104 is formed about the perimeter (or periphery) of the device region 102 to surround the semiconductor devices fabricated on the device region 102. As described in greater detail below, the inner crackstop structure 104 overlies a die edge sealing structure formed within the active layer of the semiconductor substrate 101 that circumscribes the semiconductor devices fabricated on the device region 102. In exemplary embodiments, the die edge sealing structure is realized as a conductive material formed within the outermost (after dicing) deep trench isolation region on the die structure 100 that extends through the active semiconductor layer and the buried dielectric layer to contact the handle layer of the semiconductor substrate 101, and thereby electrically connect the handle layer to the inner crackstop structure 104. In exemplary embodiments, the semiconductor substrate 101 also includes a doped contact region formed within peripheral portions of the active layer of the device region 102 proximate the die edge sealing structure, such that the doped contact region also circumscribes the semiconductor devices formed on the device region 102, wherein the inner crackstop structure 104 extends laterally to overlie the doped contact region, and thereby provide an electrical interconnection between the die edge sealing structure and the doped contact region. In this manner, the inner crackstop structure 104 and the die edge sealing structure cooperatively provide an electrical interconnection between the handle layer of the semiconductor substrate 101 and the active layer of the semiconductor substrate 101 about the periphery of the device region 102 to provide the voltage of the handle layer as a global substrate reference voltage to the semiconductor devices on the device region 102.

FIGS. 2-11 illustrate methods for fabricating an exemplary semiconductor die structure 200, such as the semiconductor die structure 100 of FIG. 1, in accordance with exemplary embodiments. Various steps in the manufacture of semiconductor devices are well known and so, in the interest of brevity, many conventional steps will only be mentioned briefly herein or will be omitted entirely without providing the well-known process details. In practice, the semiconductor die structure 200 may include multiple different semiconductor devices fabricated on a device region 210; however, for clarity and ease of explanation, and without limitation, the subject matter may be described herein using the singular form when referring to a semiconductor device fabricated on the device region 210 of the semiconductor die structure 200.

Figure 2:
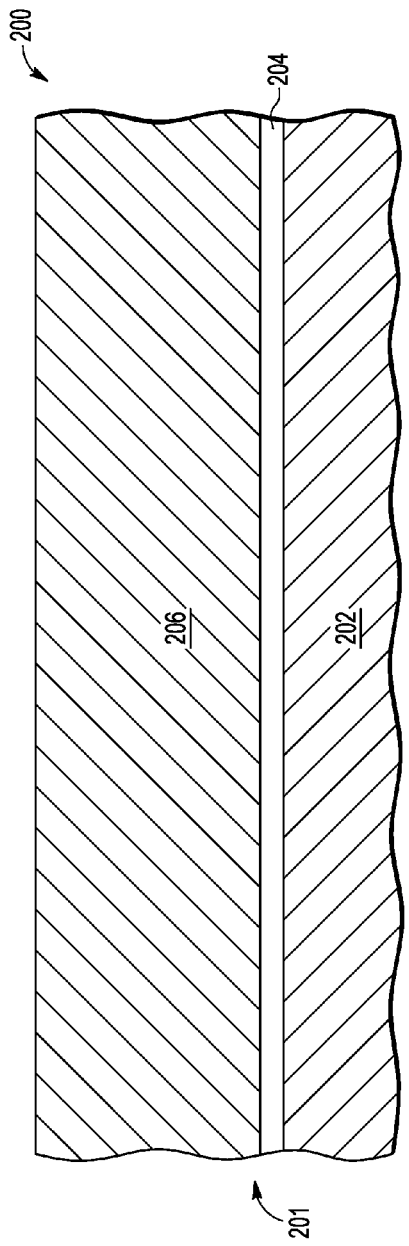
FIGS. 2-11 illustrate, in cross section, exemplary methods for fabricating a semiconductor die structure, such as the semiconductor die structure of FIG. 1, in accordance with one embodiment of the invention.

Turning now to FIG. 2, in exemplary embodiments, the die structure 200 is fabricated from a SOI substrate 201 having a handle (or support) layer 202 of semiconductor material, an buried layer 204 of dielectric material on or otherwise overlying the handle layer 202, and a upper layer 206 of semiconductor material on or otherwise overlying the buried layer 204. As described in greater detail below, in exemplary embodiments, the upper layer 206 of semiconductor material is utilized to fabricate semiconductor devices thereon, and accordingly, for convenience, but without limitation, the upper layer 206 of semiconductor material may alternatively be referred to herein as the active layer. In an exemplary embodiment, the semiconductor material of each of the layers 202, 206 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 202, 206 may be realized as germanium, gallium arsenide, and the like, and/or one or more of the layers 202, 206 may include layers of different semiconductor materials. In accordance with one embodiment, the buried layer 204 is realized as an oxide layer formed in a subsurface region of the semiconductor substrate 201, also known as a buried oxide (BOX) layer. For example, the buried layer 204 may be formed by oxidizing a wafer of semiconductor material (e.g., layer 206) which is then bonded to the handle layer 202 to provide a buried layer of oxide material between the handle layer 202 and the active layer 206. In exemplary embodiments, the handle layer 202 and the active layer 206 are each lightly doped. For example, the active layer 206 may be realized as a P-type epitaxial silicon material having a P-type dopant concentration in the range of about $1\times10^{15}/cm^3$ to about $5\times10^{15}/cm^3$, while the handle layer 202 is realized as an N-type silicon material having a N-type dopant concentration in the range of about $1\times10^{15}/cm^3$ to about $5\times10^{15}/cm^3$. In alternative embodiments, the active layer 206 may be realized as a N-type epitaxial silicon material and/or the handle layer 202 may be realized as a P-type silicon material. That said, for purposes of explanation, the subject matter will be described herein in the context of a P-type active layer 206 and an N-type handle layer 202.

Figure 3:
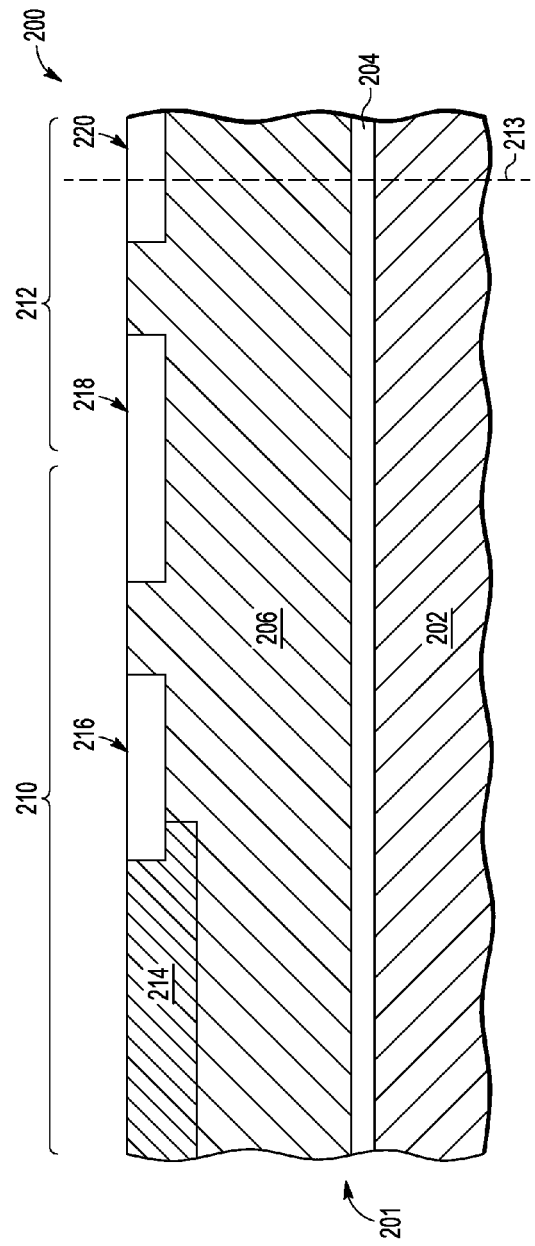

Referring to FIG. 3, in exemplary embodiments, fabrication of the die structure 200 continues by performing one or more fabrication process steps to form or otherwise fabricate one or more semiconductor devices (or components thereof) on a device region 210 of the substrate 201 prior to dicing or otherwise cutting the substrate 201 along a scribe line 213 within an edge region 212 of the substrate 201. Accordingly, the edge region 212 may alternatively be referred to herein as the scribe region. Various well known semiconductor fabrication process steps, such as photolithography, etching, ion implantation, deposition, and the like, may be performed to fabricate the semiconductor devices (or components thereof) on the device region 210 of the substrate 201. For example, in the illustrated embodiment, portions of the active layer 206 of the device region 210 may be masked with an implantation mask, and ions having a desired conductivity-determining impurity type and dopant concentration may be implanted in the active layer 206 using the implantation mask to form a well region 214 for a semiconductor device, such as a field-effect transistor (FET). Additionally, shallow isolation regions 216, 218, 220 of a dielectric material are formed in the upper portions of the device region 210 and the scribe region 212 by performing shallow trench isolation (STI). To form the shallow isolation regions 216, 218, 220, portions of the active layer 206 are masked with a masking material that is patterned to expose the active layer 206 about the periphery of the individual semiconductor devices (e.g., for shallow isolation region 216), the portions of the active layer 206 at the perimeter (or periphery) of the device region 210 (e.g., for shallow isolation region 218), and portions of the active layer 206 in the scribe region 212 that are offset from the perimeter of the device region 210 (e.g., for shallow isolation region 220). The exposed portions of the active layer 206 are then etched to a desired depth (which is less than the thickness of the active layer 206), and a dielectric material, such as an oxide material, may be deposited to a thickness greater than or equal to a depth of the trenches to fill the trenches and subsequently planarized to obtain shallow isolation regions 216, 218, 220 having upper surfaces substantially aligned with the upper surfaces of the surrounding active layer 206. In accordance with one or more exemplary embodiments, the depth of the shallow isolation regions 216, 218, 220 is in the range of about 0.1 microns to about 0.6 microns, however, it will be appreciated that the depth of the shallow isolation regions 216, 218, 220 is not constrained to any particular depth (or range thereof) and the depth may be adjusted to suit the needs of a particular application and/or fabrication process.

Turning now to FIGS. 4-8, after forming the shallow isolation regions 216, 218, 220, fabrication of the die structure 200 continues by performing deep trench isolation (DTI) to provide deep isolation regions 234, 236 that include an outer dielectric material 226 and an interior conductive material 232 that extends through the active layer 206 and the buried layer 204 to contact the handle layer 202. As described in greater detail below, a deep isolation region 234 is formed at or near the perimeter of the device region 210 along the boundary (or border) of the device region 210 with the scribe region 212 so that the deep isolation region 234 circumscribes the device region 210 and functions as a die edge sealing structure between the device region 210 and the scribe region 212 that prevents cutting defects in the active layer 206 of the scribe region 212 from propagating laterally to the active layer 206 of the device region 210. Accordingly, the deep trench isolation region 234 may alternatively be referred to herein as the die edge sealing structure. The remaining deep isolation regions 236 within the interior of the device region 210 may be utilized to provide isolation from adjacent semiconductor devices, as will be appreciated in the art.

Figure 4:
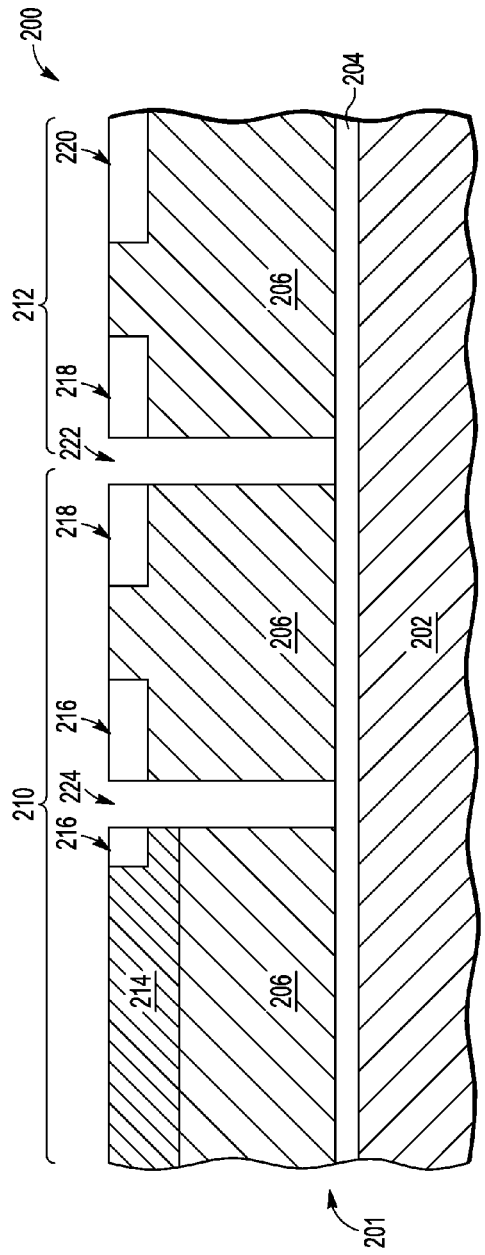
Figure 5:
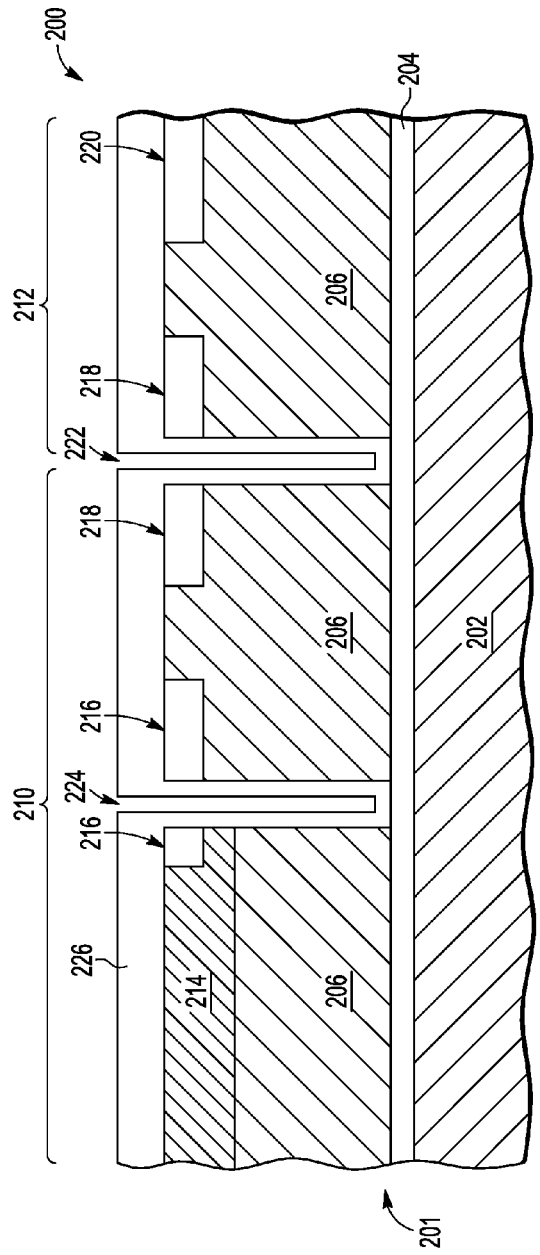

Fabrication of the deep isolation regions begins by masking the semiconductor substrate 201 with a masking material, patterning the masking material to expose portions of the active layer 206 to be utilized for the deep isolation regions 234, 236, etching the exposed portions of the active layer 206 using the remaining masking material as an etch mask to form deep trenches 222, 224 that expose the underlying buried layer 204, resulting in the die structure 200 illustrated in FIG. 4 after the masking material is removed. For example, a hard mask including a nitride material may be patterned and used as an etch mask while etching the exposed active layer 206 by reactive ion etching (RIE) with an anisotropic etchant and stopping on the buried layer 204. After forming the deep trenches 222, 224 and removing the masking material, fabrication of the deep isolation regions 234, 236 continues by forming a layer of dielectric material 226 in the trenches 222, 224, resulting in the die structure 200 illustrated in FIG. 5. Depending on the embodiment, the dielectric material 226 may be formed by oxidizing the exposed surfaces of the active layer 206 (e.g., by thermal oxidation or chemical oxidation) to grow a layer of oxide material on the exposed surfaces, or alternatively, by conformably depositing a layer of dielectric material 226 overlying the substrate 201. In exemplary embodiments, the dielectric material 226 is formed to a thickness in the range of about 200 nm to about 1000 nm, however, it will be appreciated that the thickness of the dielectric material 226 may be adjusted to provide a desired isolation or otherwise accommodate the voltage range for a particular application. In this regard, the dielectric material 226 may fill the deep trenches 222, 224 only partially in some embodiments.

Figure 6:
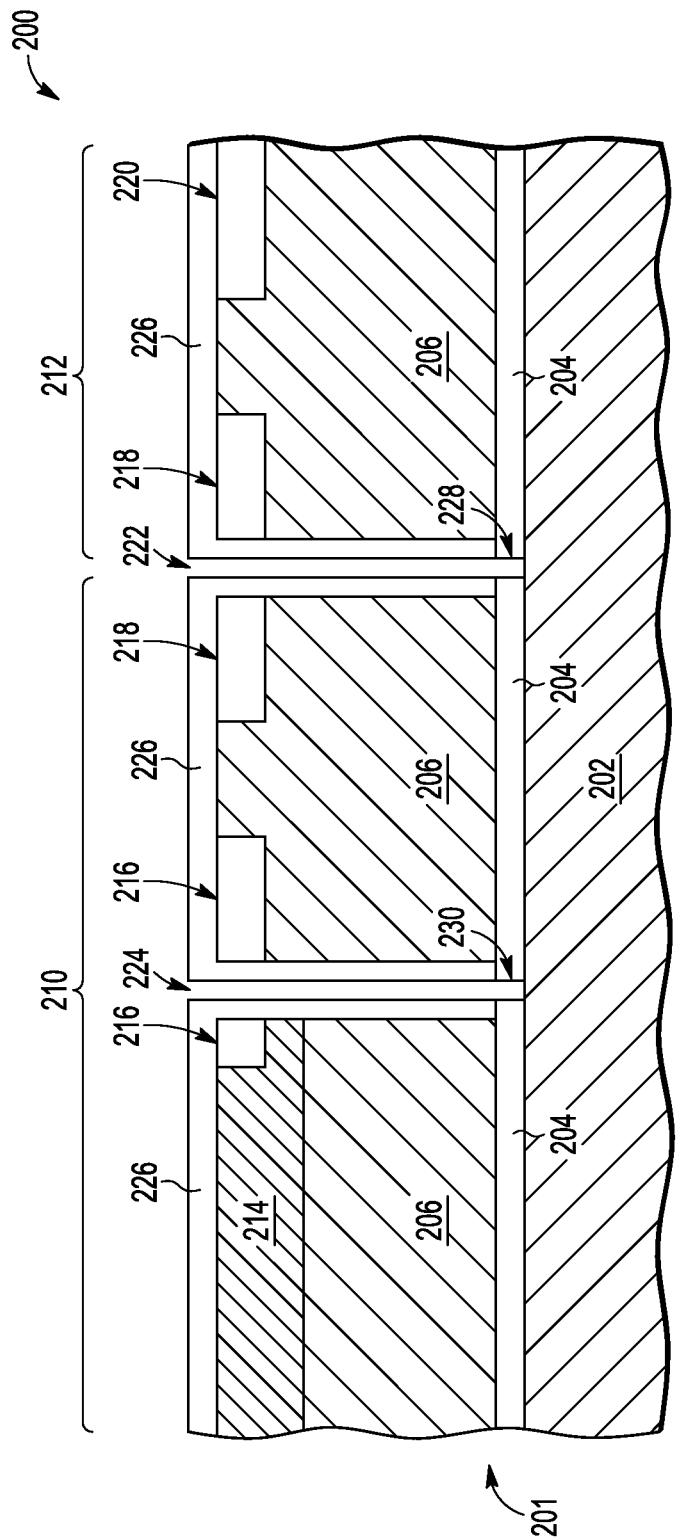
Figure 7:
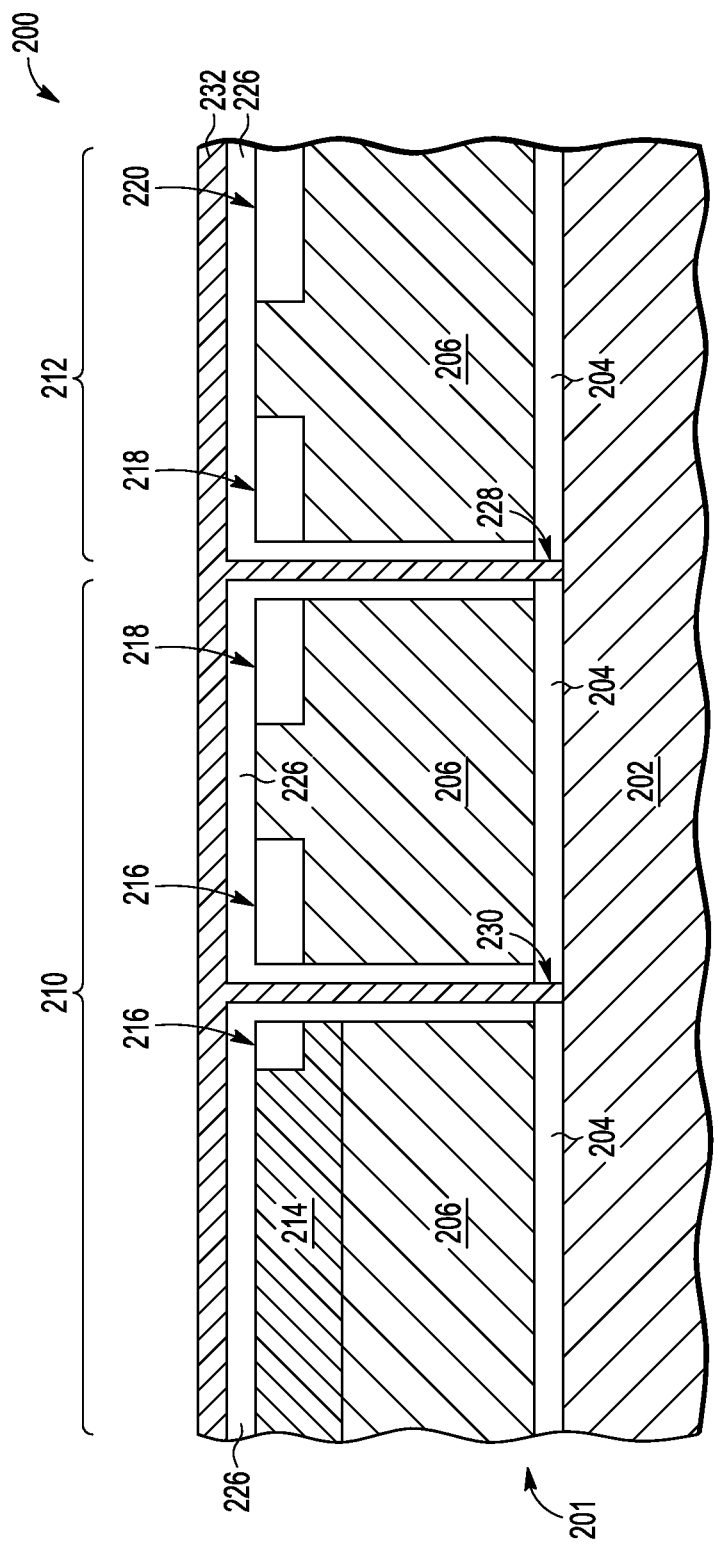
Figure 8:
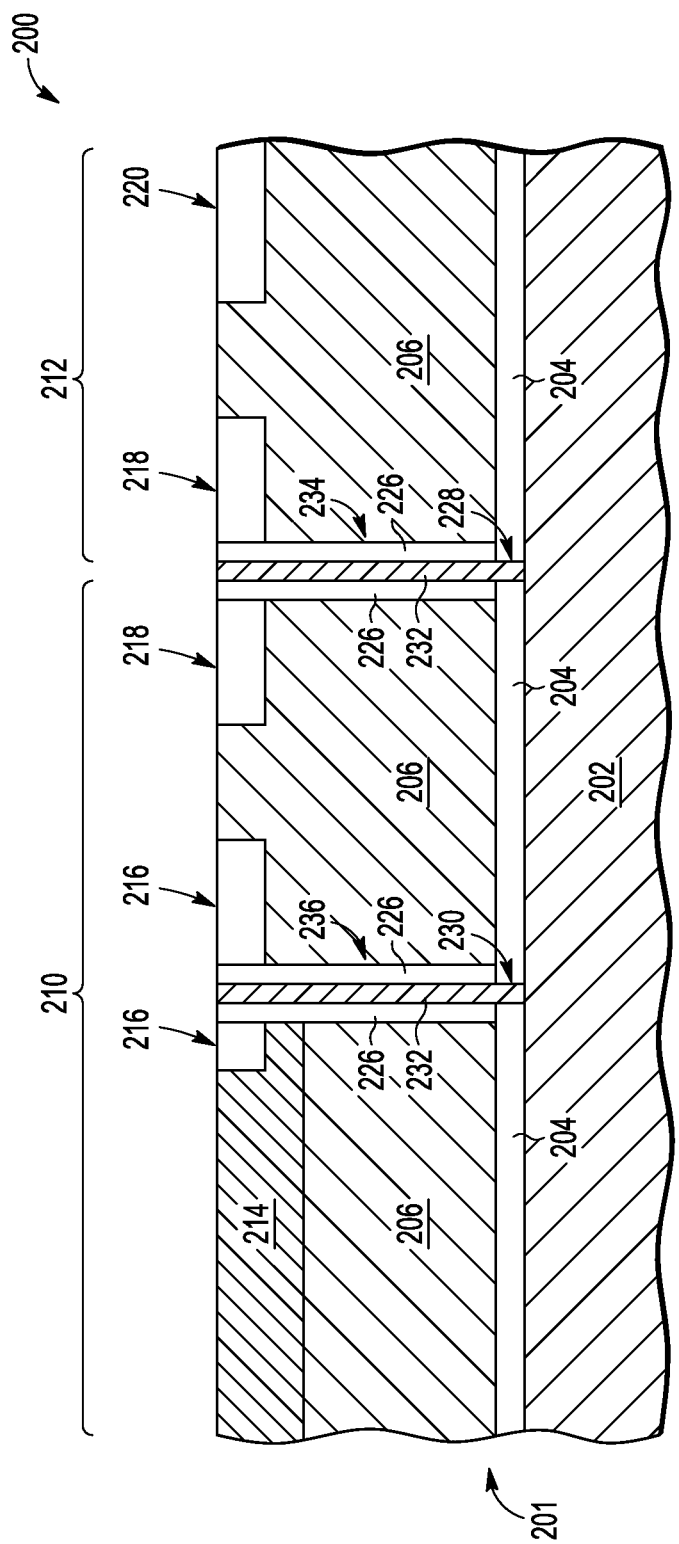

Referring now to FIGS. 6-8, after forming the dielectric material 226, fabrication of the deep isolation regions 234, 236 continues by anisotropically etching the dielectric material 226 to expose the buried layer 204 in the interior (or central) portions of the deep trenches 222, 224, and thereafter continuing anisotropically etching the exposed portions of the buried layer 204 to form voided regions 228, 230 within the deep trenches 222, 224, resulting in the die structure 200 illustrated by FIG. 6. As illustrated, the voided regions 228, 230 extend through the buried layer 204 and expose the underlying handle layer 202. After forming the voided regions 228, 230, fabrication of the deep isolation regions continues by forming a layer of conductive material 232 in the voided regions 228, 230 of the trenches 222, 224, resulting in the structure of FIG. 7. In some embodiments, the conductive material 232 is realized as a polysilicon material that is doped so that it has the same conductivity type as the underlying handle layer 202. The conductive material 232 in the voided regions 228, 230 abuts or otherwise contacts the handle layer 202 to provide an electrical connection to the handle layer 202. For example, a layer of a polysilicon material or another conductive material may be conformably deposited overlying the substrate 201 by chemical vapor deposition (CVD) or another deposition process to a thickness chosen such that the conductive material 232 fills the voided regions 228, 230 to a minimum height that meets or exceeds the height of the active layer 206 (e.g., a "flush" fill or overfill). In one or more exemplary embodiments, the conductive material 232 is in-situ doped with N-type ions, such as phosphorous ions, to provide a N-type conductive material 232 within the voided regions 228, 230 of the trenches 222, 224 that contacts the N-type handle layer 202. In an exemplary embodiment, the dopant concentration of the conductive material 232 is greater than the dopant concentration of the handle layer 202, and preferably within the range of about $1\times10^{19}/cm^3$ to about $1\times10^{21}/cm^3$ to provide the electrical connection to the handle layer 202 with relatively low resistance. After forming the conductive material 232, the fabrication process continues by planarizing the conductive material 232 and the dielectric material 226 (e.g., by chemical-mechanical planarization (CMP) or the like) to uniformly remove portions of the conductive material 232 and the dielectric material 226 across the semiconductor substrate 201 until reaching the active layer 206, resulting in the die structure 200 of FIG. 8.

Figure 9:
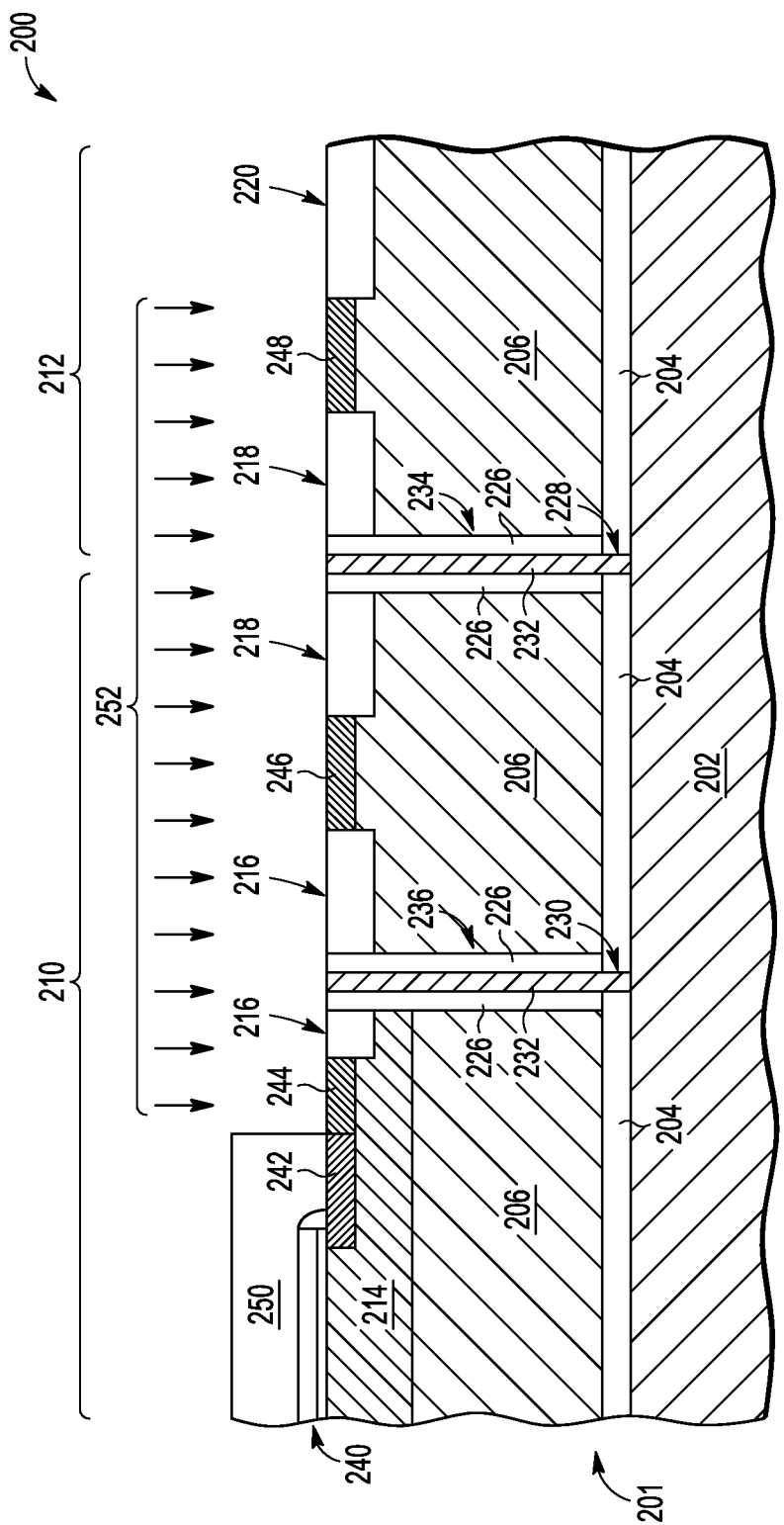

Referring now to FIG. 9, in an exemplary embodiment, the fabrication of the die structure 200 continues with various semiconductor device fabrication process steps being performed to fabricate the semiconductor devices on the interior of the device region 210. For example, a gate structure 240 for a transistor may be formed overlying at least a portion of the well region 214 in a conventional manner, for example, by forming a gate dielectric material overlying the semiconductor substrate 201, forming a conductive gate electrode material overlying the gate dielectric material, and anisotropically etching the gate dielectric material and conductive gate electrode material to form the gate structure 240. After forming the gate structure 240, fabrication of the transistor may continue by forming doped electrode contact regions 242, 244 about the gate structure 240. In exemplary embodiments, concurrently to forming an electrode contact region that has the same conductivity as the active layer 206, a doped contact region 246 is concurrently formed in peripheral portions of the active layer 206 of the device region 210 proximate the die edge sealing structure 234 to provide an electrical contact to the active layer 206 at or near the perimeter of the device region 210. In this regard, the doped contact region 246 circumscribes the semiconductor devices fabricated on the device region 210. As described in greater detail below, the doped contact region 246 is utilized to electrically connect the peripheral portions of active layer 206 at or near the perimeter of the device region 210 to the handle layer 202 via the conductive material 232 of the deep isolation region 234, and thereby, provide a global substrate reference voltage for the die structure 200. Accordingly, the doped contact region 246 may alternatively be referred to herein as the substrate contact region. A doped contact region 248 may also be concurrently formed in the scribe region 212 to comply with design rules (e.g., to allow vias 273 for the outer crackstop structure 276 to be formed thereon) and/or to provide an electrical connection to an overlying crackstop structure (e.g., outer crackstop structure 106) for plasma charge removal during fabrication.

Still referring to FIG. 9, in the illustrated embodiment, for an N-type transistor having a P-type well region 214, an N-type source electrode contact region 242 may be formed in the P-well 214 proximate the gate structure 240 by masking the substrate 201 with an implantation mask that leaves exposed the portion of the P-well 214 adjacent to the gate structure 240 and implanting N-type ions, such as phosphorous ions, with a dopant concentration in the range of about $1\times10^{19}/cm^3$ to about $1\times10^{21}/cm^3$. Although not illustrated in FIG. 9, an N-type drain electrode contact region may also be concurrently formed proximate the gate structure 240 on the side opposite the N-type source electrode contact region 242. After forming the N-type electrode contact regions, fabrication of the transistor may continue by removing the implantation mask used for the N-type implantation and forming P-type electrode contact regions, such as body electrode contact region 244 along with the doped contact regions 246, 248. To form the P-type contact regions, the substrate 201 is masked with an implantation mask 250 that masks the gate structure 240 and the source electrode contact region 242 and leaves exposed the remaining portions of the P-well region 214 along with the portions of the active layer 206 about the periphery of the device region 210 and the portions of the active layer 206 within the scribe region 212. The P-type contact regions are then formed by implanting P-type ions, illustrated by arrows 252, in the exposed portions of the P-well region 214 and active layer 206 using the implantation mask 250, resulting in the semiconductor die structure 100 of FIG. 9. The P-type contact regions 244, 246, 248 are formed by implanting P-type ions, such as boron ions, with a dopant concentration in the range of about $1\times10^{19}/cm^3$ to about $1\times10^{21}/cm^3$ at an energy level chosen so that the depth of the P-type contact regions 244, 246, 248 is less than the depth of the shallow isolation regions 216, 218, 220. In this regard, the depth and dopant concentration of the P-type contact regions 244, 246, 248 may be substantially same as the depth and dopant concentration of the N-type contact regions 242 but with opposite conductivity. In exemplary embodiments, the implantation mask 250 exposes the portions of the active layer 206 about the entire periphery of the device region 210 adjacent to the shallow isolation region 218 so that the substrate contact region 246 is formed as a substantially contiguous region about the perimeter of the device region 210 that is offset from the deep isolation region 234 by the shallow isolation region 218. In this manner, the substrate contact region 246 circumscribes the semiconductor devices on the device region 210. After the P-type contact regions 244, 246, 248 are formed, the fabrication of the die structure 200 continues by removing the implantation mask 250 and performing additional front-end-of-line (FEOL) fabrication process steps to complete fabrication of the semiconductor devices on the device region 210.

Figure 10:
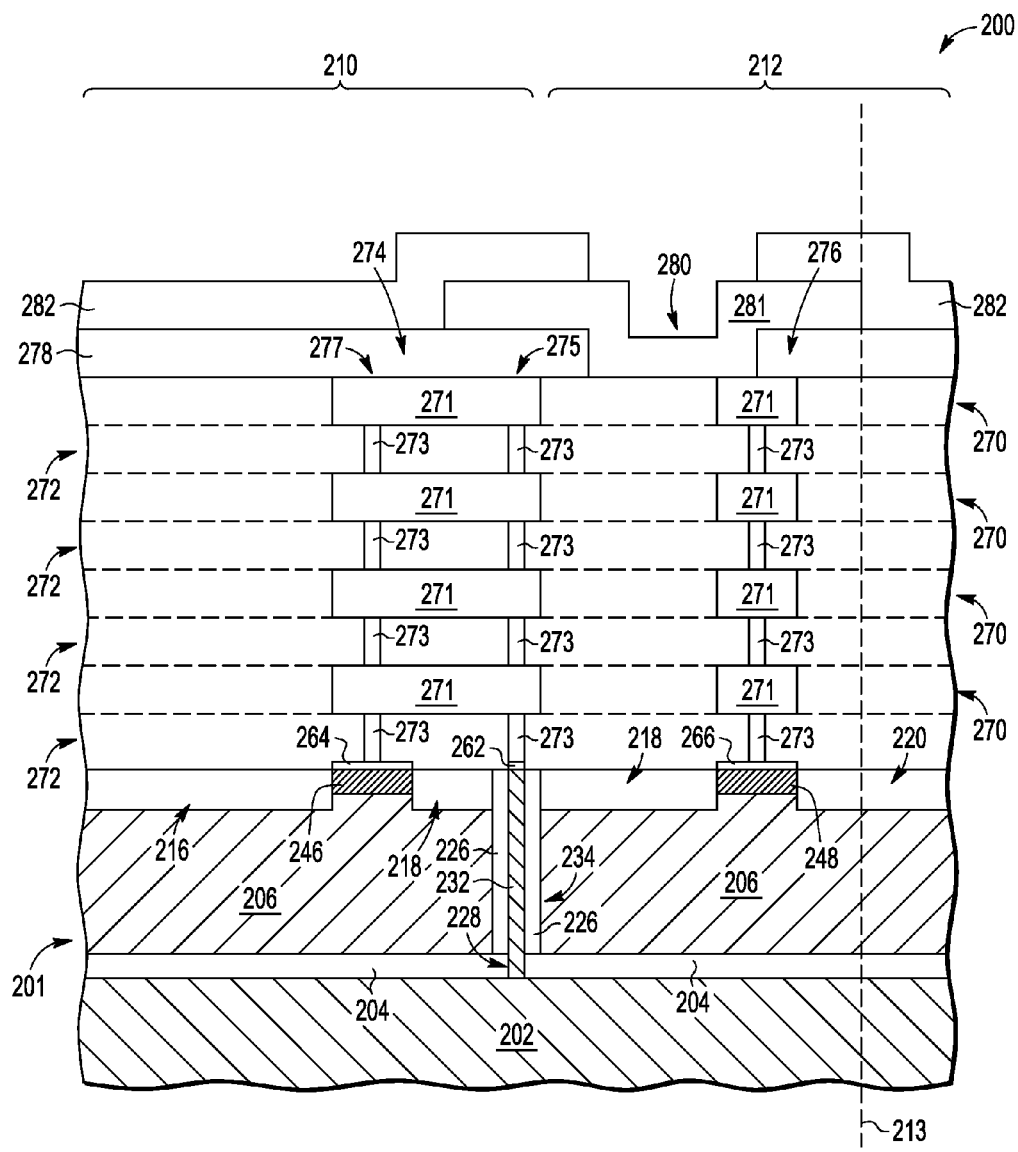

Referring now to FIG. 10, after the appropriate FEOL fabrication process steps have been performed to fabricate the desired semiconductor devices on the device region 210, fabrication of the die structure 200 continues by performing back-end-of-line (BEOL) fabrication process steps including forming contacts 262, 264, 266 on the contact regions 246, 248 and the conductive material 232 concurrently to forming contacts (not illustrated in FIG. 10) on the gate structure 240 and the contact regions 242, 244. In exemplary embodiments, the contacts 262, 264, 266 are realized as a metal silicide layer formed by conformably depositing a layer of silicide-forming metal onto the exposed surfaces of the contact regions 242, 244, 246, 248, the gate structure 240, and the conductive material 232 and heating the die structure 200, for example by rapid thermal annealing (RTA), to react the silicide-forming metal with the exposed silicon and form metal silicide contacts 262, 264, 266 at the top of the die edge sealing structure 234, the respective contact regions 242, 244, 246, 248, and the gate structure 240, with the unreacted silicide-forming metal being removed thereafter. After forming contacts, fabrication of the die structure 200 continues by forming one or more layers 270 of metal material configured to provide electrical interconnections between semiconductor devices on the device region 210 with corresponding intervening layers 272 of dielectric material (e.g., the interlayer dielectric) having conductive vias disposed therein. The metallization layers 270 and via layers 272 are formed overlying the substrate 201, wherein each of the metallization layers 270 includes a conductive metal material 271 (e.g., copper, aluminum, or the like) patterned to provide the desired lateral interconnections among semiconductor devices on the device region 210 while the via layers 272 include a conductive via material 273 (e.g., tungsten, copper, aluminum, or the like) patterned to provide vertical connections to/from the metallization layers 270 and the semiconductor devices on the substrate 201 that result in the desired interconnections among semiconductor devices.

In exemplary embodiments, the metallization layers 270 are patterned or otherwise formed so that portions of the conductive metal material 271 of a respective metallization layer 270 remain intact overlying the doped contact regions 246, 248 and the die edge sealing structure 234, and similarly, the via layers 272 are patterned or otherwise formed so that portions of the conductive via material 273 of a respective via layer 272 remain intact overlying the doped contact regions 246, 248 and the conductive material 232 of the die edge sealing structure 234 to provide vertical connections from the doped contact regions 246, 248 and the die edge sealing structure 234 to the overlying portions of metal material 271. In this regard, the portions of metal material 271 and conductive via material 273 overlying the conductive material 232 of the die edge sealing structure 234 provide a first vertical conductive structure 275 and the portions of metal material 271 and conductive via material 273 overlying the substrate contact region 246 provide a second vertical conductive structure 277, with the portions of the metal material 271 of the metallization layers 270 overlying the substrate contact region 246 and the die edge sealing structure 234 (e.g., the metal material 271 of the vertical conductive structures 275, 277) being integral to provide lateral electrical interconnections between the vertical conductive structures 275, 277. In this manner, the metal material 271 and conductive via material 273 overlying the doped contact region 246 and the die edge sealing structure 234 provide an inner crackstop structure 274 (e.g., inner crackstop structure 104) that provides an electrical connection between the substrate contact region 246 and the conductive material 232 of the die edge sealing structure 234, thereby providing an electrical interconnection between the handle layer 202 and the active layer 206 at the periphery of the device region 210, such that the voltage of the handle layer 202 functions as a global substrate reference voltage for the device region 210 of the die structure 200. Similarly, the materials 271, 273 of the metallization and via layers 270, 272 are patterned to provide a vertical conductive structure 276 overlying the doped contact region 248 in the scribe region 212 that circumscribes the device region 210 to provide an outer crackstop structure (e.g., outer crackstop structure 106).

Figure 11:
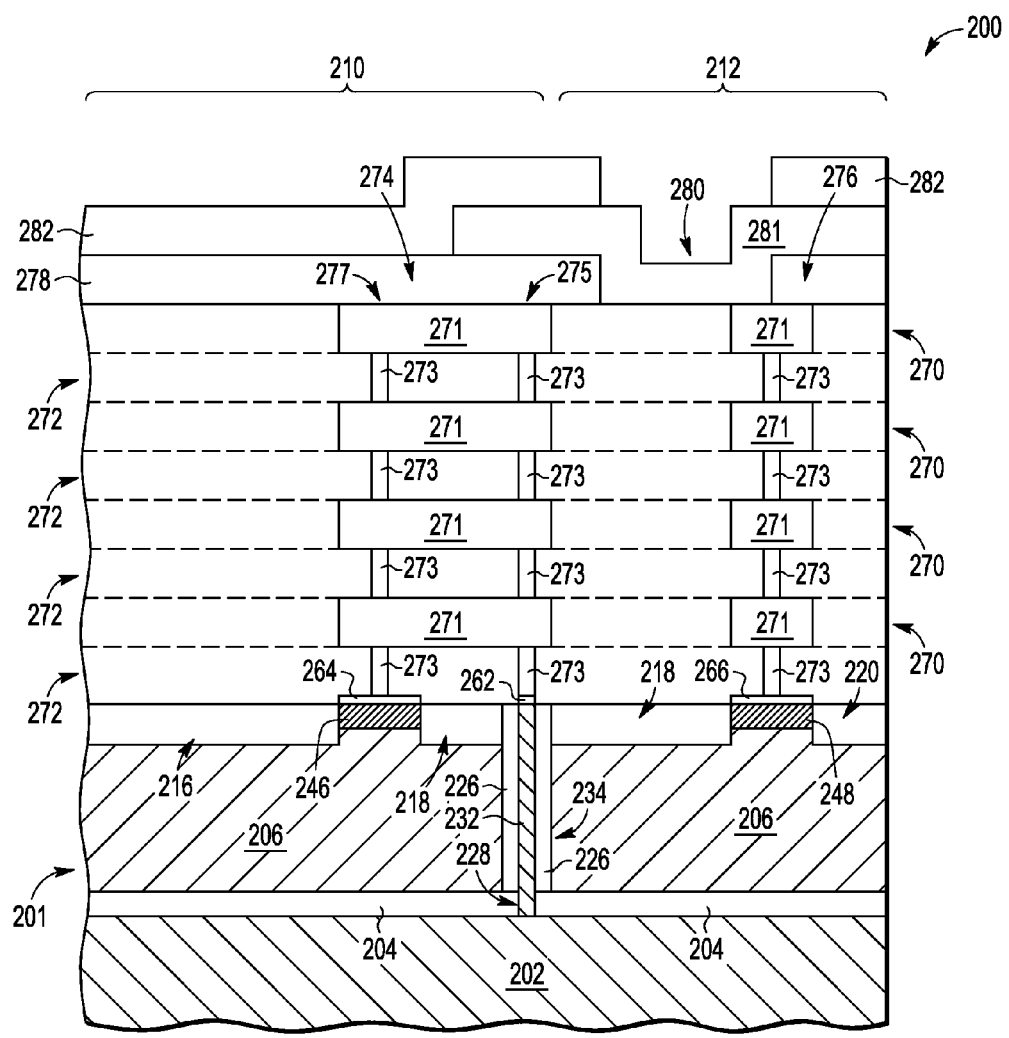

After forming the lower metal and via layers 270, 272, fabrication of the die structure 200 is completed by forming one or more layers of passivation material 278, 282 overlying the substrate 201, forming a cap 280 for the outer crackstop structure 276 that overlies the edge of the device region 210, and cutting or otherwise dicing the substrate 201 along the scribe line 213 within the scribe region 212 to obtain the die structure 200 of FIG. 11. For example, a first passivation layer 278 may be realized as a layer of dielectric material (e.g., a nitride material, an oxide material, another suitable dielectric material and/or a combination of dielectric materials) conformably deposited overlying the substrate. After forming the first passivation layer 278, the cap 280 is formed by etching the passivation layer 278 to remove portions of the passivation layer 278 overlying the outer crackstop structure 276, forming a layer of capping material 281, such as aluminum or another metal material, overlying the passivation layer 278, and etching the capping material 281 to remove portions of the capping material 281 overlying the interior of the device region 210 and portions of the capping material 281 outside of the scribe line 213. In this manner, the remaining capping material 281 overlies the inner crackstop structure 274 and provides a cap 280 for the outer crackstop structure 276 that circumscribes the die structure 200 after dicing. After the cap 280 is formed, a second layer of passivation material 282 (e.g., a nitride material, an oxide material, another suitable dielectric material and/or a combination of dielectric materials) is formed overlying the layer of passivation material 278 and the cap 280, for example, by conformal deposition. Although one or more additional BEOL fabrication process may be formed next (e.g., polyimide formation and the like), in the illustrated embodiment, the fabrication process is completed by cutting or otherwise dicing the substrate 201 along the scribe line 213 to obtain the resulting die structure 200 illustrated in FIG. 11. Referring again to FIG. 1, a top view of the die structure 200 of FIG. 11 resembles the die structure 100 depicted in FIG. 1 that has an outer crackstop structure 106, 276 at or near the perimeter of the die structure 100, 200 and an inner crackstop structure 104, 274 at or near the perimeter of the device region 102, 210, with the inner crackstop structure 104, 274 overlying a die edge sealing structure 234 along the border of the device region 102, 210 and providing an electrical connection between the handle layer 202 of the semiconductor substrate 101, 201 and the peripheral portions of the active layer 206 of the device region 102, 210. After the die structure 100, 200 is singulated, fabrication of an integrated circuit including the die structure 100, 200 may be completed, for example, by mounting or otherwise affixing the die structure 100, 200 to a package substrate and encapsulating the die structure 100, 200 with a molding compound.

To briefly summarize, one advantage of the subject matter described herein is that the semiconductor die structure includes a die edge sealing structure along the border of the device region within the substrate semiconductor material that inhibits lateral propagation of cutting defects in the scribe region of the semiconductor substrate into the device region of the substrate. Additionally, the die edge sealing structure includes a conductive material that contacts an inner crackstop structure overlying the die edge sealing structure to provide an electrical connection between the peripheral portions of the device region and the underlying handle layer of semiconductor material via the die edge sealing structure. Furthermore, the inner crackstop structure provides additional protection from lateral propagation of cutting defects in the metallization and/or via layers overlying the scribe region to the metallization and/or via layers overlying the device region. By virtue of the die edge sealing structure and the buried layer of dielectric material, the semiconductor material of the device region is isolated from the semiconductor material of the scribe region and the handle layer of semiconductor material, so that propagation of a cutting defect in the semiconductor material of the scribe region or the handle layer of semiconductor material to the device region is inhibited.

For the sake of brevity, conventional techniques related to semiconductor and/or integrated circuit fabrication, wafer dicing, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

An apparatus is provided for a die structure. The die structure comprises a diced portion of a semiconductor substrate including a first layer of semiconductor material and a buried layer of dielectric material, and a sealing structure within the first layer of the semiconductor substrate and the buried layer of dielectric material. The diced portion includes a device region of the first layer, the device region has one or more semiconductor devices fabricated thereon, and the sealing structure circumscribes the device region. In one embodiment, the semiconductor substrate includes a handle layer of semiconductor material, the buried layer overlies the handle layer, the first layer overlies the buried layer, and the sealing structure contacts the handle layer. In a further embodiment, the die structure further comprises a contact region within the first layer of the device region proximate the sealing structure, the contact region circumscribing the one or more semiconductor devices, wherein the contact region is electrically connected to the sealing structure. In one embodiment, the sealing structure circumscribes the contact region. In another embodiment, the contact region and the first layer have a first conductivity type and the sealing structure and the handle layer have a second conductivity type, which may be opposite the first conductivity type. In another embodiment, the die structure further comprises a crackstop structure overlying the contact region and the sealing structure to electrically connect the contact region to the sealing structure. In a further embodiment, the crackstop structure comprises a first vertical conductive structure overlying the contact region, a second vertical conductive structure overlying the sealing structure, and one or more conductive lateral interconnections between the first vertical conductive structure and the second vertical conductive structure. In accordance with yet another embodiment, the die structure further comprises a crackstop structure circumscribing the device region, wherein the crackstop structure overlies the sealing structure. In a further embodiment, the crackstop structure electrically connects the first layer to the sealing structure and the sealing structure is electrically connected to the handle layer. In another embodiment, the sealing structure comprises a conductive material within an outermost deep trench isolation region in the diced portion of the semiconductor substrate.

In another exemplary embodiment, an apparatus for a device is provided. The device comprises a semiconductor substrate including a handle layer of semiconductor material, a buried layer of dielectric material on the handle layer, and a first layer of semiconductor material on the buried layer, a sealing structure within the semiconductor substrate between a device region of the semiconductor substrate and an edge region of the semiconductor substrate, and a crackstop structure overlying the sealing structure, wherein the sealing structure electrically connects the crackstop structure to the handle layer. In one embodiment, the sealing structure comprises a conductive material within the first layer and the buried layer that contacts the handle layer. In a further embodiment, the device further comprises a doped contact region within the device region proximate the sealing structure, wherein the crackstop structure overlies the doped contact region and the conductive material and electrically connects the conductive material to the device region of the first layer. In one embodiment, the device region includes one or more semiconductor devices fabricated thereon and the contact region circumscribes the one or more semiconductor devices. In accordance with another embodiment, the device further comprises an outer crackstop structure on the edge region of the semiconductor substrate, the outer crackstop structure circumscribing the crackstop structure.

An exemplary method is provided for fabricating an electronic device on a semiconductor substrate comprising a handle layer of semiconductor material, a buried layer of dielectric material overlying the handle layer, and a first layer of semiconductor material overlying the buried layer. The method comprises forming one or more semiconductor devices on a device region of the first layer of semiconductor material, forming a sealing structure in the first layer of semiconductor material and the buried layer of dielectric material between the device region and a scribe region of the semiconductor substrate, the sealing structure circumscribing the device region, and dicing the semiconductor substrate within the scribe region. In one embodiment, the method further comprises forming a first crackstop structure overlying the sealing structure and the device region, the first crackstop structure providing an electrical connection between the sealing structure and the device region. In another embodiment, forming the sealing structure comprises forming a conductive material contacting the handle layer within the first layer and the buried layer, and forming the first crackstop structure comprises forming a first vertical conductive structure overlying the conductive material. In a further embodiment, the method further comprises forming a contact region within the device region proximate the sealing structure, wherein forming the first crackstop structure further comprises forming a second vertical conductive structure overlying the contact region and laterally interconnecting the second vertical conductive structure and the first vertical conductive structure. In accordance with another embodiment, the method further comprises forming a second crackstop structure overlying the scribe region, the second crackstop structure circumscribing the first crackstop structure, wherein the first crackstop structure and the second crackstop structure remain with a diced portion of the semiconductor substrate after the dicing.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A die structure comprising:
   a diced portion of a semiconductor substrate including a first layer of semiconductor material, a buried layer of dielectric material, and a handle layer of semiconductor material, the buried layer overlying the handle layer and the first layer overlying the buried layer, the diced portion including a device region of the first layer, the device region having one or more semiconductor devices fabricated thereon;
   a sealing structure within the first layer of the semiconductor substrate and the buried layer of dielectric material, the sealing structure contacting the handle layer and circumscribing the device region; and
   a crackstop structure circumscribing the device region, the crackstop structure overlying the sealing structure, wherein the crackstop structure and the sealing structure cooperate to electrically connect the handle layer to the first layer to provide a voltage of the handle layer as a reference voltage for the device region.

2. The die structure of claim 1, further comprising a contact region within the first layer of the device region proximate the sealing structure, the contact region circumscribing the one or more semiconductor devices, wherein the contact region is electrically connected to the sealing structure.

3. The die structure of claim 2, wherein the sealing structure circumscribes the contact region.

4. The die structure of claim 2, wherein the crackstop structure overlies the contact region and the sealing structure to electrically connect the contact region to the sealing structure.

5. The die structure of claim 4, wherein the crackstop structure comprises:
   a first vertical conductive structure overlying the contact region;
   a second vertical conductive structure overlying the sealing structure; and
   one or more conductive lateral interconnections between the first vertical conductive structure and the second vertical conductive structure.

6. The die structure of claim 1, wherein:
   the crackstop structure electrically connects the first layer to the sealing structure; and
   the sealing structure is electrically connected to the handle layer.

7. The die structure of claim 1, wherein the sealing structure comprises a conductive material within an outermost deep trench isolation region in the diced portion of the semiconductor substrate.

8. The die structure of claim 1, wherein the crackstop structure comprises portions of via layers and metallization layers patterned to provide a vertical conductive structure.

9. The die structure of claim 8, wherein the crackstop structure is configured to provide protection from lateral propagation of cutting defects in one or more of the via layers or the metallization layers to the one or more of the via layers or the metallization layers overlying the device region.

10. The die structure of claim 1, wherein the crackstop structure is formed about a perimeter of the device region to surround the one or more semiconductor devices.

11. The die structure of claim 1, wherein the sealing structure is at or near a perimeter of the device region.

12. A die structure comprising:
a diced portion of a semiconductor substrate including a first layer of semiconductor material, a buried layer of dielectric material, and a handle layer of semiconductor material, the buried layer overlying the handle layer and the first layer overlying the buried layer, the diced portion including a device region of the first layer, the device region having one or more semiconductor devices fabricated thereon;
a sealing structure within the first layer of the semiconductor substrate and the buried layer of dielectric material, the sealing structure circumscribing the device region and contacting the handle layer; and
a contact region within the first layer of the device region, wherein:
the contact region is electrically connected to the sealing structure;
the contact region and the first layer have a first conductivity type; and
the sealing structure and the handle layer have a second conductivity type.

13. A device comprising:
a semiconductor substrate including a handle layer of semiconductor material, a buried layer of dielectric material on the handle layer, and a first layer of semiconductor material on the buried layer;
a sealing structure within the semiconductor substrate, the sealing structure circumscribing a device region of the semiconductor substrate between the device region and an edge region of the semiconductor substrate; and
a crackstop structure overlying the sealing structure, the crackstop structure providing an electrical interconnection between the first layer and the sealing structure, wherein the sealing structure electrically connects the crackstop structure to the handle layer to provide a voltage of the handle layer as a reference voltage for the device region.

14. The device of claim 13, wherein the sealing structure comprises a conductive material within the first layer and the buried layer that contacts the handle layer.

15. The device of claim 14, further comprising a doped contact region within the device region proximate the sealing structure, wherein the crackstop structure overlies the doped contact region and the conductive material and electrically connects the conductive material to the device region of the first layer.

16. The device of claim 15, wherein:
the device region includes one or more semiconductor devices fabricated thereon; and
the contact region circumscribes the one or more semiconductor devices.

17. The device of claim 13, wherein the crackstop structure comprises portions of via layers and metallization layers patterned to provide a vertical conductive structure.

18. The device of claim 13, wherein the crackstop structure is formed about a perimeter of the device region to surround semiconductor devices fabricated on the device region.

19. A device comprising:
a semiconductor substrate including a handle layer of semiconductor material, a buried layer of dielectric material on the handle layer, and a first layer of semiconductor material on the buried layer;
a sealing structure within the semiconductor substrate between a device region of the semiconductor substrate and an edge region of the semiconductor substrate;
a crackstop structure overlying the sealing structure, wherein the sealing structure electrically connects the crackstop structure to the handle layer; and
an outer crackstop structure on the edge region of the semiconductor substrate, the outer crackstop structure circumscribing the crackstop structure.

* * * * *